(12) United States Patent
Oka et al.

(10) Patent No.: US 9,763,335 B2
(45) Date of Patent: Sep. 12, 2017

(54) BALL MOUNTING METHOD AND WORKING MACHINE FOR BOARD

(75) Inventors: Hiromitsu Oka, Chiryu (JP); Tetsuo Hayashi, Chiryu (JP)

(73) Assignee: FUJI MACHINE MFG. CO., LTD., Chiryu-shi (JP)

(*) Notice: Subject to any disclaimer, the term of this patent is extended or adjusted under 35 U.S.C. 154(b) by 130 days.

(21) Appl. No.: 14/389,480

(22) PCT Filed: Apr. 10, 2012

(86) PCT No.: PCT/JP2012/059769
§ 371 (c)(1),
(2), (4) Date: Sep. 30, 2014

(87) PCT Pub. No.: WO2013/153616
PCT Pub. Date: Oct. 17, 2013

(65) Prior Publication Data
US 2015/0060529 A1    Mar. 5, 2015

(51) Int. Cl.
*B23K 1/00* (2006.01)
*B23K 1/20* (2006.01)
(Continued)

(52) U.S. Cl.
CPC ......... *H05K 3/3484* (2013.01); *B23K 1/0016* (2013.01); *B23K 1/20* (2013.01);
(Continued)

(58) Field of Classification Search
CPC ..... H01L 2924/00; H01L 24/75; H01L 24/11; H01L 21/67144; H05K 3/3478;
(Continued)

(56) References Cited

U.S. PATENT DOCUMENTS

| | | |
|---|---|---|
| 5,844,320 A | 12/1998 | Ono et al. |
| 2006/0185157 A1* | 8/2006 | Shida ............... H01L 21/67144 29/740 |
| 2010/0314433 A1 | 12/2010 | Healy |

FOREIGN PATENT DOCUMENTS

| | | |
|---|---|---|
| JP | 8-340174 | 12/1996 |
| JP | 9-246321 A | 9/1997 |

(Continued)

OTHER PUBLICATIONS

Computer english translation JP2002-368044A.*

(Continued)

*Primary Examiner* — Erin Saad
(74) *Attorney, Agent, or Firm* — Oblon, McClelland, Maier & Neustadt, L.L.P.

(57) ABSTRACT

A working machine for a board including a working device that selectively performs work for mounting conductive balls on a circuit board by a ball holder and work for transferring viscous fluid onto the circuit board by transfer pins, and a tray in which the viscous fluid is stored, when the conductive balls are to be mounted on the circuit board, the viscous fluid being transferred onto the circuit board by the transfer pins and the conductive balls having been immersed in the viscous fluid are mounted on the transferred viscous fluid. Accordingly, the conductive balls can be fixed onto the circuit board by the viscous fluid, which is transferred onto the circuit board by the transfer pins, and the viscous fluid that adheres to the conductive balls due to the immersion of the conductive balls in the viscous fluid.

3 Claims, 8 Drawing Sheets

(51) Int. Cl.
*B23K 3/00* (2006.01)
*H05K 3/34* (2006.01)
*B23K 3/06* (2006.01)
*H01L 21/50* (2006.01)

(52) U.S. Cl.
CPC .......... *B23K 3/0623* (2013.01); *B23K 3/0638* (2013.01); *H01L 21/50* (2013.01); *H05K 3/3478* (2013.01); *H01L 2221/00* (2013.01); *H01L 2924/0002* (2013.01); *H05K 3/3489* (2013.01); *H05K 2203/041* (2013.01); *H05K 2203/0425* (2013.01)

(58) Field of Classification Search
CPC .......... H05K 2203/041; H05K 3/3489; H05K 13/046; H05K 2203/082; B23K 1/0016; B23K 1/203; B23K 1/206; B23K 3/08; B23K 3/082
USPC ............... 228/223, 245, 253, 33, 36, 41
See application file for complete search history.

(56) References Cited

FOREIGN PATENT DOCUMENTS

| | | |
|---|---|---|
| JP | 9-246704 | 9/1997 |
| JP | 9-260836 | 10/1997 |
| JP | 2001-284787 | 10/2001 |
| JP | 2002-26505 A | 1/2002 |
| JP | 2002-368044 | 12/2002 |
| JP | 2004-15006 | 1/2004 |
| JP | 2007-287888 | 11/2007 |
| JP | 2010-267672 A | 11/2010 |

OTHER PUBLICATIONS

Supplementary European Search Report dated Aug. 4, 2015 in European Patent Application No. EP 12 87 4180.
International Search Report issued May 22, 2012, in PCT/JP2012/059769, filed Apr. 10, 2012.

* cited by examiner

BALL MOUNTING METHOD AND WORKING MACHINE FOR BOARD

BACKGROUND

The present application relates to a ball mounting method of mounting conductive balls on a circuit board, and a working machine for a board that performs work for mounting conductive balls on a circuit board.

Viscous fluid is used to mount conductive balls on a circuit board, and the conductive balls are fixed onto the circuit board by the viscous fluid. Specifically, as described in, for example, the following PTL 1, viscous fluid is transferred onto a circuit board by transfer pins that transfer the viscous fluid adhering to tip end portions thereof to the circuit board and conductive balls are mounted on the transferred viscous fluid. As a result, the conductive balls are fixed onto the circuit board by the viscous fluid.

PTL 1: JP-A-2004-15006

Technical Problem

If a force for holding the conductive balls, which is generated by viscous fluid, is small when the conductive balls are to be fixed onto the circuit board by using viscous fluid, there is a concern that the conductive balls may not appropriately be mounted on the circuit board. In particular, since there is a case in which tens of thousands to hundreds of thousands of conductive balls are to be mounted on the circuit board, the frequency of occurrence of a defect such as the unmounting of the conductive balls in this case becomes high. For this reason, a method of increasing the amount of transferred viscous fluid by repeating the transfer of the viscous fluid onto a circuit board using transfer pins at least two times is employed in a ball mounting method disclosed in PTL 1.

However, in the ball mounting method disclosed in PTL 1, the viscous fluid, which is transferred onto the circuit board by the first transfer using the transfer pins, adheres to tip ends of the transfer pin at the time of the second transfer using the transfer pins. Accordingly, since the viscous fluid, which is transferred onto the circuit board, is removed by the transfer pins, there is a concern that the amount of viscous fluid present on the circuit board may be reduced by the second transfer using the transfer pins. There is a concern that the amount of viscous fluid transferred onto the circuit board may not be increased but reduced in the ball mounting method disclosed in PTL 1 as described above. Accordingly, there is a concern that the conductive balls cannot be appropriately mounted on the circuit board.

BRIEF SUMMARY

The present application has been made in consideration of the above-mentioned circumstances, and an object of the present application is to provide a ball mounting method that allows conductive balls to be appropriately mounted on a circuit board, and a working machine for a board.

Solution to Problem

In order to achieve the object, a ball mounting method according to a first aspect of the present disclosure is a method of mounting conductive balls on a circuit board in a working machine for a board, the working machine for a board including: a holding device that is provided on a base and holds a circuit board at a position where work for the circuit board is performed; a working device that selectively performs work for mounting the conductive balls on the circuit board by a ball holder holding the conductive balls and work for transferring viscous fluid onto the circuit board by a viscous fluid transfer tool including transfer pins transferring the viscous fluid, which adheres to tip end portions thereof, to the circuit board; a moving device that moves the working device to a specific position on the base; and a viscous fluid tray in which the viscous fluid is stored, the ball mounting method including: a transfer pin immersion step of immersing the transfer pins of the viscous fluid transfer tool in the viscous fluid stored in the viscous fluid tray; a viscous fluid transfer step of transferring the viscous fluid onto the circuit board by the transfer pins that have been immersed in the viscous fluid; a ball immersion step of immersing the conductive balls, which are held by the ball holder, in the viscous fluid stored in the viscous fluid tray; and a ball mounting step of mounting the conductive balls, which have been immersed in the viscous fluid, on the circuit board onto which the viscous fluid has been transferred in the viscous fluid transfer step.

In another aspect of the present disclosure, the working machine for a board includes first and second trays as the viscous fluid tray, and viscous fluid having viscosity higher than the viscosity of viscous fluid stored in the second tray is stored in the first tray, in the transfer pin immersion step, the transfer pins are immersed in the viscous fluid stored in the first tray, and in the ball immersion step, the conductive balls, which are held by the ball holder, are immersed in the viscous fluid stored in the second tray.

In another aspect of the present disclosure, the working machine for a board includes first and second trays, which store viscous fluid in the form of a thin film, as the viscous fluid tray, and the film thickness of the viscous fluid stored in the first tray is larger than the film thickness of the viscous fluid stored in the second tray, in the transfer pin immersion step, the transfer pins are immersed in the viscous fluid stored in the first tray, and in the ball immersion step, the conductive balls, which are held by the ball holder, are immersed in the viscous fluid stored in the second tray.

In another aspect of the present disclosure, a working machine for a board includes a holding device that is provided on a base and holds a circuit board at a position where work for the circuit board is performed; a working device that selectively performs work for mounting the conductive balls on the circuit board by a ball holder holding the conductive balls and work for transferring viscous fluid onto the circuit board by a viscous fluid transfer tool including transfer pins transferring the viscous fluid, which adheres to tip end portions thereof, to the circuit board; a moving device that moves the working device to a specific position on the base; a viscous fluid tray in which the viscous fluid is stored; and a control device that controls operation of the working device and the moving device, wherein the control device includes a transfer pin immersing unit that immerses the transfer pins of the viscous fluid transfer tool in the viscous fluid stored in the viscous fluid tray, a viscous fluid transferring unit that transfers the viscous fluid onto the circuit board by the transfer pins having been immersed in the viscous fluid, a ball immersing unit that immerses the conductive balls held by the ball holder in the viscous fluid stored in the viscous fluid tray, and a ball mounting unit that mounts the conductive balls having been immersed in the viscous fluid on the circuit board onto which the viscous fluid has been transferred by the viscous fluid transferring unit.

In another aspect of the present disclosure, the working machine includes first and second trays as the viscous fluid tray, and viscous fluid having viscosity higher than the viscosity of viscous fluid stored in the second tray is stored in the first tray, the transfer pin immersing unit immerses the transfer pins in the viscous fluid stored in the first tray, and the ball immersing unit immerses the conductive balls, which are held by the ball holder, in the viscous fluid stored in the second tray.

In another aspect of the present disclosure, the working machine includes first and second trays, which store viscous fluid in the form of a thin film, as the viscous fluid tray, and the thickness of film of the viscous fluid stored in the first tray is larger than the thickness of film of the viscous fluid stored in the second tray, the transfer pin immersing unit immerses the transfer pins in the viscous fluid stored in the first tray, and the ball immersing unit immerses the conductive balls, which are held by the ball holder, in the viscous fluid stored in the second tray.

Advantageous Effects

In another aspect of the present disclosure, the viscous fluid is transferred onto the circuit board by the transfer pins and the conductive balls having been immersed in the viscous fluid are mounted on the transferred viscous fluid. That is, the conductive balls can be fixed onto the circuit board by the viscous fluid, which is transferred onto the circuit board by the transfer pins, and the viscous fluid that adheres to the conductive balls due to the immersion of the conductive balls in the viscous fluid. Therefore, since it is possible to increase a force for holding the conductive balls by a large amount of viscous fluid, it is possible to appropriately mount the conductive balls on the circuit board.

In another aspect of the present disclosure, viscous fluid having relatively high viscosity is stored in the first tray in which the transfer pins are immersed. Accordingly, when viscous fluid having high viscosity is transferred onto the circuit board, it is possible to more preferably mount the conductive balls on the circuit board by a high holding force that is generated by the viscous fluid having high viscosity. Meanwhile, when the conductive balls, which are held by the ball holder, are immersed in the viscous fluid having high viscosity, there is a concern that the conductive balls may be left in the second tray due to a high holding force generated by the viscous fluid having high viscosity. Accordingly, viscous fluid having relatively low viscosity is stored in the second tray in which the conductive balls, which are held by the ball holder, are immersed. Therefore, it is possible to prevent the conductive balls, which are held by the ball holder, from being left in the second tray.

In another aspect of the present disclosure, viscous fluid having relatively small film thickness is stored in the second tray in which the conductive balls held by the ball holder are immersed. This is to immerse only very small conductive balls in the viscous fluid, and the amount of viscous fluid adhering to the conductive balls is very small. Meanwhile, viscous fluid having a relatively large film thickness is stored in the first tray in which the transfer pins are immersed. The reason for this is that the length of the transfer pin is much larger than the diameter of the conductive ball. Accordingly, the amount of viscous fluid adhering to the transfer pin becomes relatively large. Therefore, since it is possible to hold the conductive balls on the circuit board by a large amount of viscous fluid, it is possible to appropriately mount the conductive balls on the circuit board.

DETAILED DESCRIPTION

An embodiment of the present application will be described in detail below with reference to the drawings.

<Structure of Device for Performing Work for Board>

Figure 1:
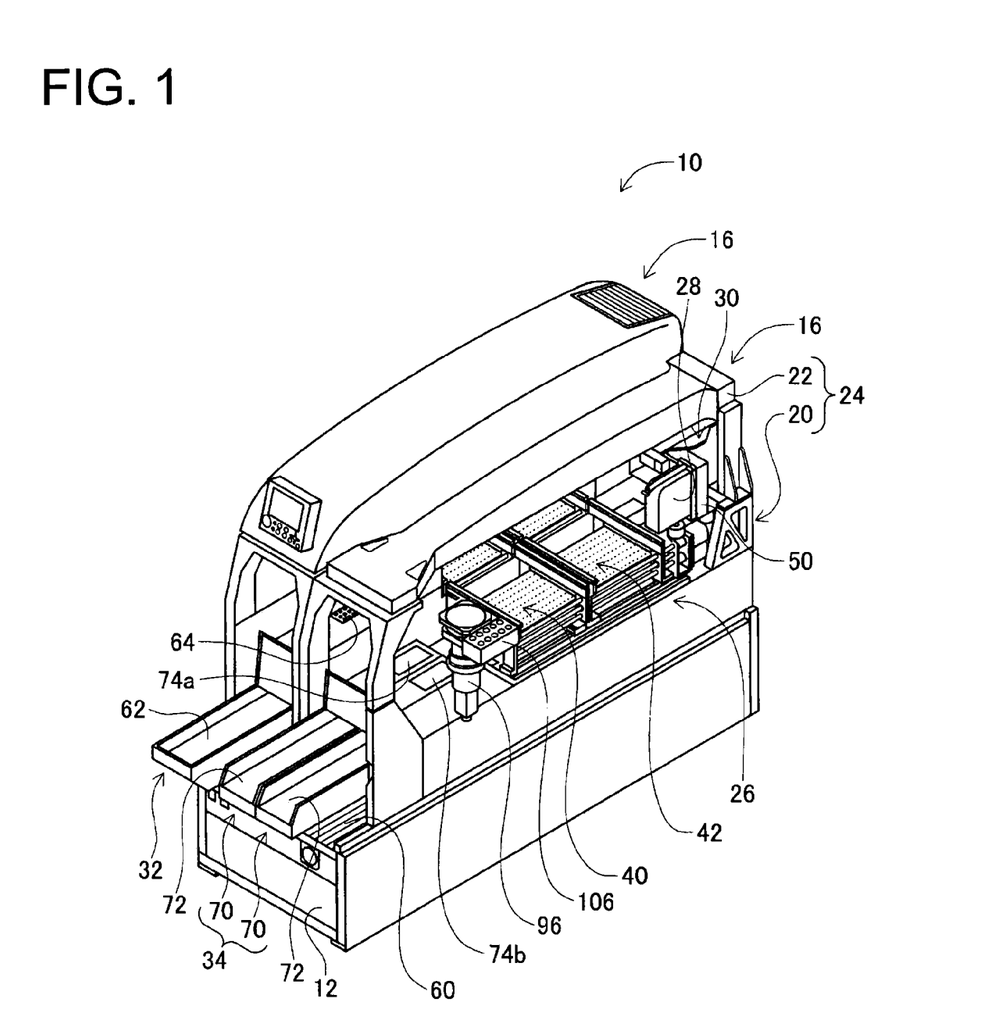
FIG. 1 is a perspective view showing a working device for a board in which two working machines for a board according to an embodiment of the present application are disposed side by side.

FIG. 1 shows a mounting apparatus 10 for performing work for a board (hereinafter, simply referred to as a "working apparatus"). FIG. 1 is a perspective view from which a part of exterior components of the working apparatus 10 are removed. The working apparatus 10 includes one system base 12 and two machines 16 for performing work on a board (hereinafter, simply referred to as "working machines") that are arranged side by side on the system base 12 so as to be adjacent to each other, and is to perform work on a circuit board. Meanwhile, in the following description, a direction in which the working machines 16 are arranged side by side is referred to as an X-axis direction and a horizontal direction orthogonal to the direction is referred to as a Y-axis direction.

Each of the working machines 16, which are included in the working apparatus 10, mainly includes a working machine body 24 that includes a frame portion 20 and a beam portion 22 provided on the frame portion 20, a conveying device 26 that conveys a circuit board in the X-axis direction and clamps the circuit board at a set position, a working head 28 that performs work on the circuit board clamped by the conveying device 26, a moving device 30 that is provided on the beam portion 22 and moves the working head 28 in the X-axis direction and the Y-axis direction, a solder ball supply device 32 that is provided in front of the frame portion 20 and supplies solder balls, and a flux supply device 34 that supplies flux to be transferred onto the circuit board.

The conveying device 26 includes two conveyor units 40 and 42. These two conveyor units 40 and 42 are parallel to each other, and are provided in the middle of the frame portion 20 in the Y-axis direction so as to extend in the X-axis direction. The respective two conveyor units 40 and 42 are adapted to convey circuit boards, which are supported by the respective conveyor units 40 and 42, in the X-axis direction by an electromagnetic motor (see FIG. 4) 46 and to hold and clamp the circuit boards at a predetermined position by a board holding unit (see FIG. 4) 48.

The moving device 30 is an XY robot type moving device. The moving device 30 includes an electromagnetic motor (see FIG. 4) 52 that slides a slider 50 for holding the working head 28 in the X-axis direction, and an electromagnetic motor (see FIG. 4) 54 that slides the slider 50 in the Y-axis direction. Accordingly, the moving device 30 can move the working head 28 to a specific position on the frame portion 20 by the operation of these two electromagnetic motors 52 and 54.

The solder ball supply device 32 is a device for supplying solder balls, which are arranged so as to correspond to a pattern of solder balls to be mounted on the circuit board, to the working head 28. Since the structure of the solder ball supply device 32 is the same as that of a solder ball supply device disclosed in JP-A-2011-91192, the structure of the solder ball supply device 32 will be briefly described. The solder ball supply device 32 includes a body base 62 that is detachably mounted on a device table 60 formed at a front end portion of the frame portion 20, and a ball alignment plate 64 that is provided at an end portion of the body base 62 facing the conveying device 26. A predetermined number of ball holes (see FIG. 3) 66 are formed on the ball alignment plate 64. Since the predetermined number of ball holes 66 are arranged so as to correspond to the pattern of the solder balls to be mounted on the circuit board, one solder ball is received in each of the ball holes 66. Further, when a squeegee (not shown) in which spaces receiving the plurality of solder balls are formed is made to slide on the ball alignment plate 64, the solder balls are received in the ball holes formed on the ball alignment plate 64. Accordingly, the predetermined number of solder balls are supplied while being arranged so as to correspond to the pattern of the solder balls to be mounted on the circuit board.

Further, the flux supply device 34 includes two flux suppliers 70. Each of the flux suppliers 70 includes a body base 72 that is detachably mounted on the device table 60, and a flux tray 74 that is provided at an end portion of the body base 72 facing the conveying device 26. Since the structure of each of the flux suppliers 70 is the same as that of a flux supplier disclosed in JP-A-2012-43904, flux is stored in the flux tray 74 of each of the flux suppliers 70 in the form of a thin film. Flux having relatively high viscosity is stored in one flux tray (hereinafter, referred to as a "first flux tray 74a") of the two flux trays 74, and flux of which viscosity is lower than the viscosity of the flux stored in the first flux tray 74a is stored in the other flux tray (hereinafter, referred to as a "second flux tray 74b").

Figure 2:
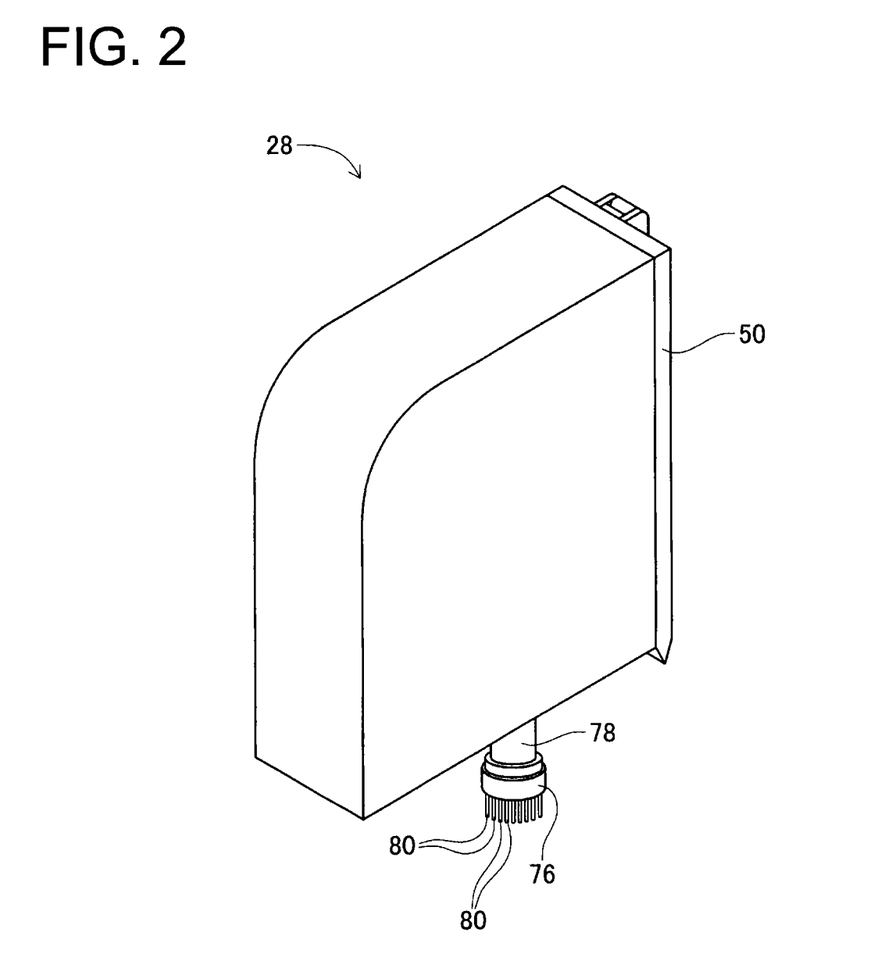
FIG. 2 is a perspective view of a working head which is included in the working machine for a board shown in FIG. 1 and on which a flux transfer tool is mounted.

Further, the working head 28 performs various kind of work on the circuit board that is held by the conveying device 26, and is detachably mounted on the slider 50 that is moved to a specific position on the frame portion 20 by the moving device 30 as shown in FIG. 2. The working head 28 includes a working tool holding unit 78 holding a flux transfer tool 76, which transfers flux onto the circuit board, at a tip end portion thereof. The flux transfer tool 76 includes a plurality of transfer pins 80 that extend downward, and is adapted to make flux adhere to tip end portions of the plurality of transfer pins 80 and to be capable of performing work for transferring the adhering flux onto the circuit board.

Figure 3:
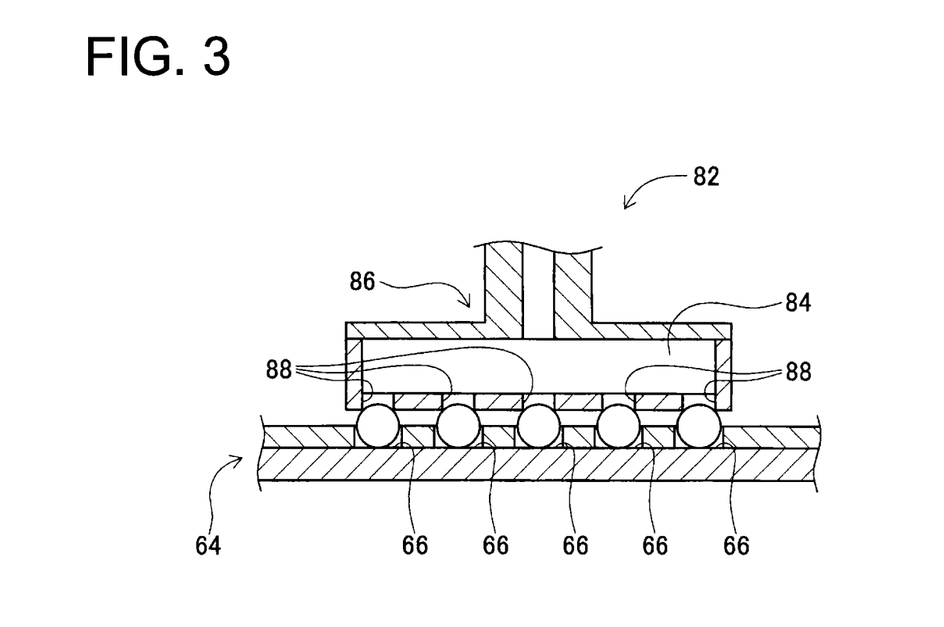
FIG. 3 is a cross-sectional view showing a ball holder that can be mounted on the working head shown in FIG. 2.

Furthermore, the flux transfer tool 76 is detachably mounted on the working tool holding unit 78, and a ball holder 82 shown in FIG. 3 can be mounted on the tip end portion of the working tool holding unit 78 instead of the flux transfer tool 76. The ball holder 82 is adapted to hold the solder balls, which are supplied by the solder ball supply device 32, by suction, and can perform work for mounting the solder balls on the circuit board by separating the solder balls, which are held through suction, from the ball holder onto the circuit board.

The ball holder 82 includes a housing 86 in which an air chamber 84 is formed, and a predetermined number of suction holes 88 are formed on the lower end face of the housing 86 in the same pattern to be arranged as the pattern of the predetermined number of ball holes 66 of the ball alignment plate 64. Further, the predetermined number of suction holes 88 communicate with the air chamber 84. In addition, a positive/negative pressure supply unit (see FIG. 4) 89 is connected to the air chamber 84. Accordingly, when air is sucked from the respective suction holes 88 of the ball holder 82, solder balls can be held at the respective suction holes 88 by suction.

Furthermore, the working head 28 includes a unit lifting unit (see FIG. 4) 90 that moves the working tool holding unit 78 holding the flux transfer tool 76 or the ball holder 82 up and down, and a unit rotating unit (see FIG. 4) 92 that rotates the working tool holding unit 78 about an axis of the working tool holding unit 78. Accordingly, the position of the flux transfer tool 76 or the ball holder 82 in a vertical direction and an angle of the working tool holding unit 78 about the axis can be changed.

Moreover, the working machine 16 includes a mark camera (see FIG. 4) 94 and a part camera (see FIGS. 1 and 4) 96. Since the mark camera 94 is fixed to the lower surface of the slider 50 so as to face downward and is moved by the moving device 30, the mark camera 94 can take an image at any position on the circuit board. Meanwhile, since the part camera 96 is provided on the frame portion 20 so as to face upward, the part camera 96 can take an image of the flux transfer tool 76 or the ball holder 82 mounted on the working head 28. Image data taken by the mark camera 94 and image data taken by the part camera 96 are processed by an image processor (see FIG. 4) 98, and various kinds of information obtained through the processing of the image data are used in work, which will be described in detail below, for mounting solder balls on the circuit board.

Figure 4:
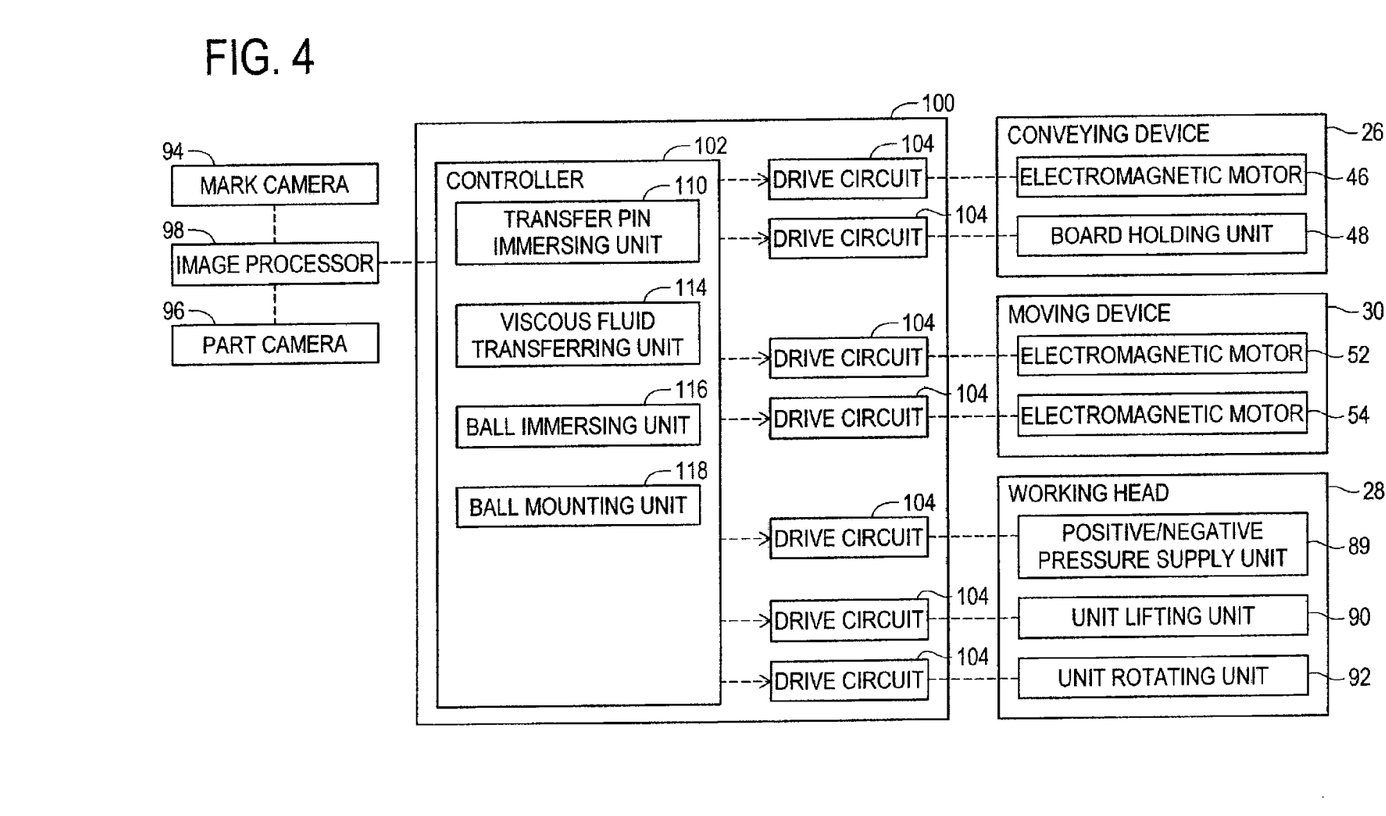
FIG. 4 is a block diagram of a control device that is included in the working machine for a board shown in FIG. 1.

Further, the working machine 16 includes a control device 100 as shown in FIG. 4. The control device 100 includes: a controller 102 that is mainly formed of a computer including a CPU, a ROM, a RAM, and the like; and a plurality of drive circuits 104 that correspond to the electromagnetic motors 46, 52, and 54, the board holding unit 48, the positive/negative pressure supply unit 89, the unit lifting unit 90, and the unit rotating unit 92, respectively. Furthermore, since driving sources, such as the conveying device and the moving device, are connected to the controller 102 through the respective drive circuits 104, the operations of the conveying device, the moving device, and the like can be controlled.

<Work for Mounting Solder Balls on Circuit Board>

Work for mounting solder balls on the circuit board can be performed in the working machine 16 by the above-mentioned structure. A method of mounting solder balls, which is performed for the work, will be described below. Specifically, first, circuit boards are conveyed to work positions and are held and clamped at the positions by the conveyor units 40 and 42. Next, the working head 28 is moved to a position above the circuit board by the moving device 30 and an image of the circuit board is taken by the mark camera 94. Positional errors of the circuit boards, which are held by the conveyor units 40 and 42, are acquired by the image taking.

After the image is taken by the mark camera 94, the working head 28 is moved to a position above the part camera 96 by the moving device 30. That is, the flux transfer tool 76 is mounted on the working tool holding unit 78 of the working head 28, and the ball holder 82 is stored in a working tool station 106 that is provided above the frame portion 20. Meanwhile, a working tool mounted on the working tool holding unit 78 and a working tool stored in the working tool station 106 can be automatically exchanged in the working tool station 106.

An image of the working head 28, which has been moved to the position above the part camera 96, is taken from below by the part camera 96, and information on the rotation angle of the flux transfer tool 76 is acquired by the image taking. Further, after the image is taken by the part camera 96, the working head 28 is moved to a position above the first flux tray 74a by the moving device 30.

Figure 5:
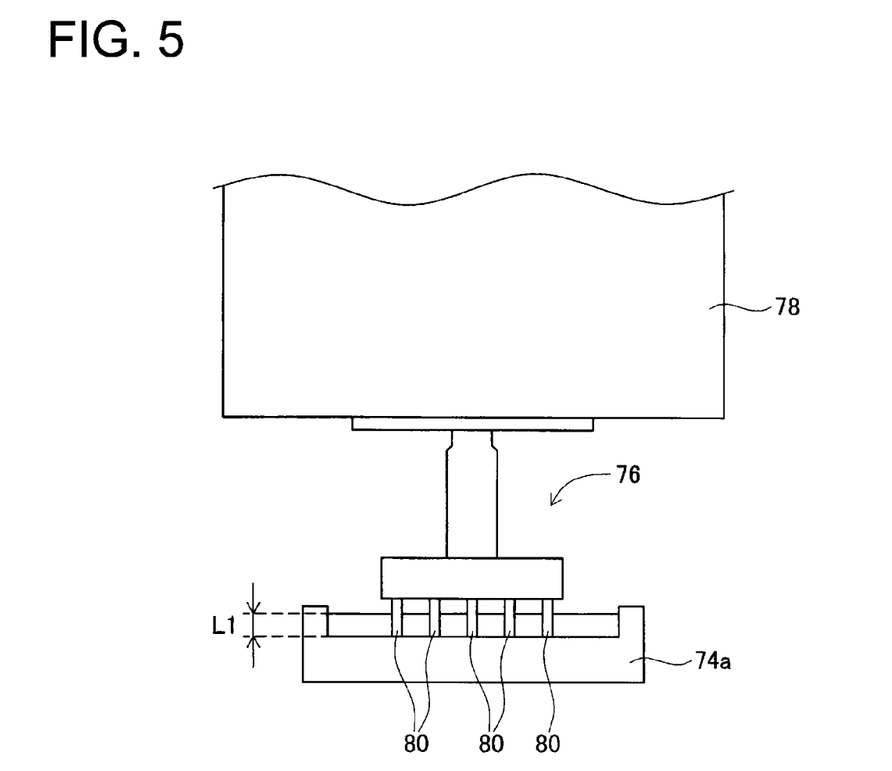
FIG. 5 is a schematic view showing the flux transfer tool of which transfer pins are immersed in flux.

The working head 28, which has been moved to the position above the first flux tray 74a, moves the working tool holding unit 78 down by the unit lifting unit 90 and immerses the transfer pins 80 of the flux transfer tool 76 in the flux, which is stored in the first flux tray 74a, as shown in FIG. 5. The film thickness L1 of the flux, which is stored in the first flux tray 74a, is a thickness corresponding to a length shorter than the length of the transfer pin 80. Accordingly, even though the transfer pins 80 come into contact with the bottom of the first flux tray 74a, only the transfer pins 80 are immersed in the flux. Meanwhile, a step of immersing the transfer pins 80 in the first flux tray 74a is a transfer pin immersion step, and a transfer pin immersing unit (see FIG. 4) 110 is provided in the controller 102 of the control device 100 as a functional unit that performs this step.

Figure 6:
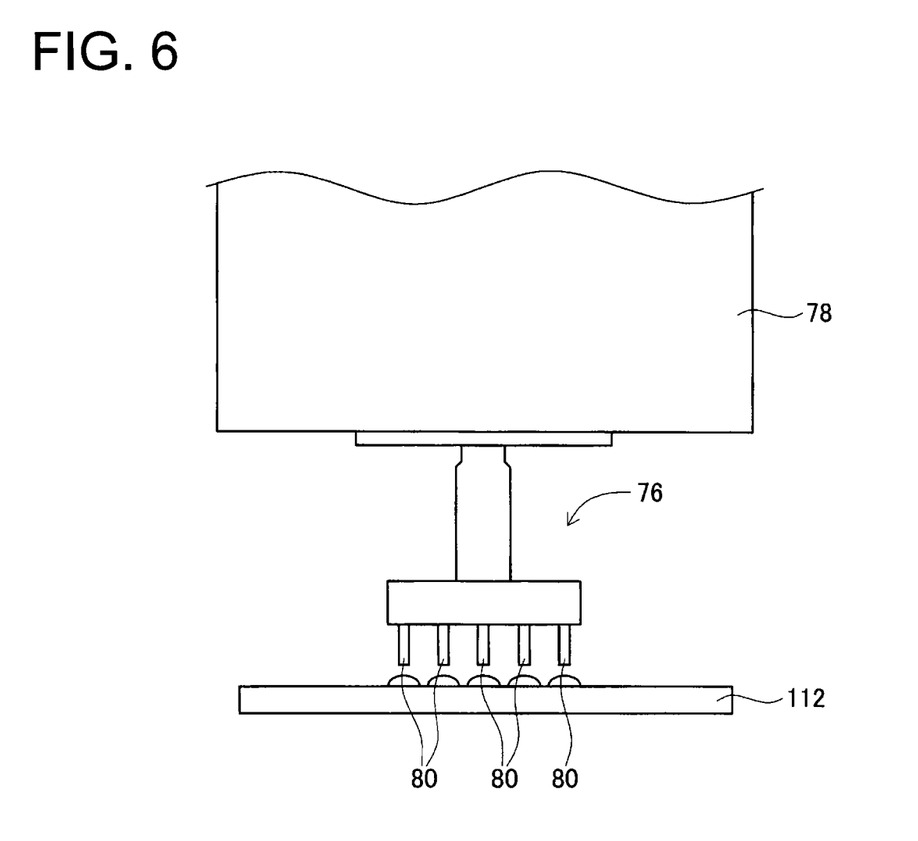
FIG. 6 is a schematic view showing the flux transfer tool when flux is transferred onto a circuit board.

After the transfer pin immersion step ends, the working head 28 is moved to a position above the circuit board by the moving device 30. Further, the working head 28 adjusts the rotation angle of the flux transfer tool 76 by the unit rotating unit 92 on the basis of the holding position errors of the circuit boards, which are obtained by the image taking, and the rotation angle of the flux transfer tool 76. After that, the working tool holding unit 78 is moved down by the unit lifting unit 90. Accordingly, tip end portions of the transfer pins 80 of the flux transfer tool 76 come into contact with the surface of the circuit board, and the flux adhering to the tip end portions of the transfer pins 80 is transferred onto a circuit board 112 as shown in FIG. 6. Meanwhile, a step of transferring flux onto the circuit board 112 by the transfer pins 80 is a viscous fluid transfer step, and a viscous fluid transferring unit (see FIG. 4) 114 is provided in the controller 102 of the control device 100 as a functional unit that performs this step.

After the viscous fluid transfer step ends, the working head 28 is moved to a position above the working tool station 106 by the moving device 30. Further, the flux transfer tool 76, which is held by the working tool holding unit 78, is exchanged with the ball holder 82 that is stored in the working tool station 106. Meanwhile, since the automatic exchange of the working tool is a well-known technique, the description thereof will be omitted.

After work for exchanging the working tool ends, the working head 28 on which the ball holder 82 is mounted is moved to a position above the part camera 96 by the moving device 30. An image of the working head 28, which has been moved to the position above the part camera 96, is taken from below by the part camera 96, and information on the rotation angle of the ball holder 82 is acquired by the image taking. Further, after the image is taken by the part camera 96, the working head 28 is moved to a position above the ball alignment plate 64 of the solder ball supply device 32 by the moving device 30.

The working head 28, which has been moved to the position above the ball alignment plate 64, adjusts the rotation angle of the ball holder 82 by the unit rotating unit 92 on the basis of the rotation angle of the ball holder 82 that is obtained by the image taking. After that, the working tool holding unit 78 is moved down by the unit lifting unit 90. Meanwhile, when the working tool holding unit 78 is moved down, negative pressure is supplied to the air chamber 84 of the ball holder 82 by the positive/negative pressure supply unit 89. Accordingly, air is sucked from the respective suction holes 88 of the ball holder 82. Therefore, solder balls are held at the respective suction holes 88 of the ball holder 82 by suction as shown in FIG. 3.

Figure 7:
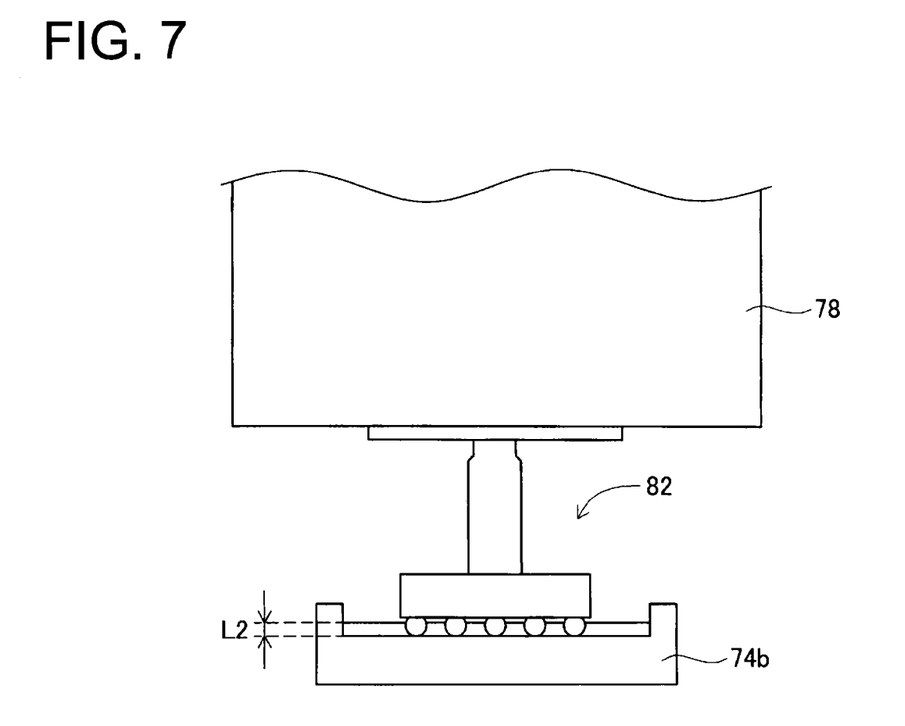
FIG. 7 is a schematic view showing the ball holder of which solder balls are immersed in flux.

Further, the working head 28, which holds solder balls through suction by the ball holder 82, is moved to a position above the second flux tray 74b by the moving device 30. The working head 28, which has been moved to a position above the second flux tray 74b, moves the working tool holding unit 78 down by the unit lifting unit 90 and immerses the solder balls, which are held through suction by the ball holder 82, in flux that is stored in the second flux tray 74b as shown in FIG. 7. The film thickness L2 of the flux, which is stored in the second flux tray 74b, is very small. Accordingly, even though the solder balls, which are held through suction by the ball holder 82, come into contact with the bottom of the second flux tray 74b, only the solder balls are immersed in the flux. For this reason, the film thickness L2 of the flux, which is stored in the second flux tray 74b, is much smaller than the film thickness L1 of the flux that is stored in the first flux tray 74a. Meanwhile, a step of immersing the solder balls, which are held through suction by the ball holder 82, in the second flux tray 74b is a ball immersion step, and a ball immersing unit (see FIG. 4) 116 is provided in the controller 102 of the control device 100 as a functional unit that performs this step.

Figure 8:
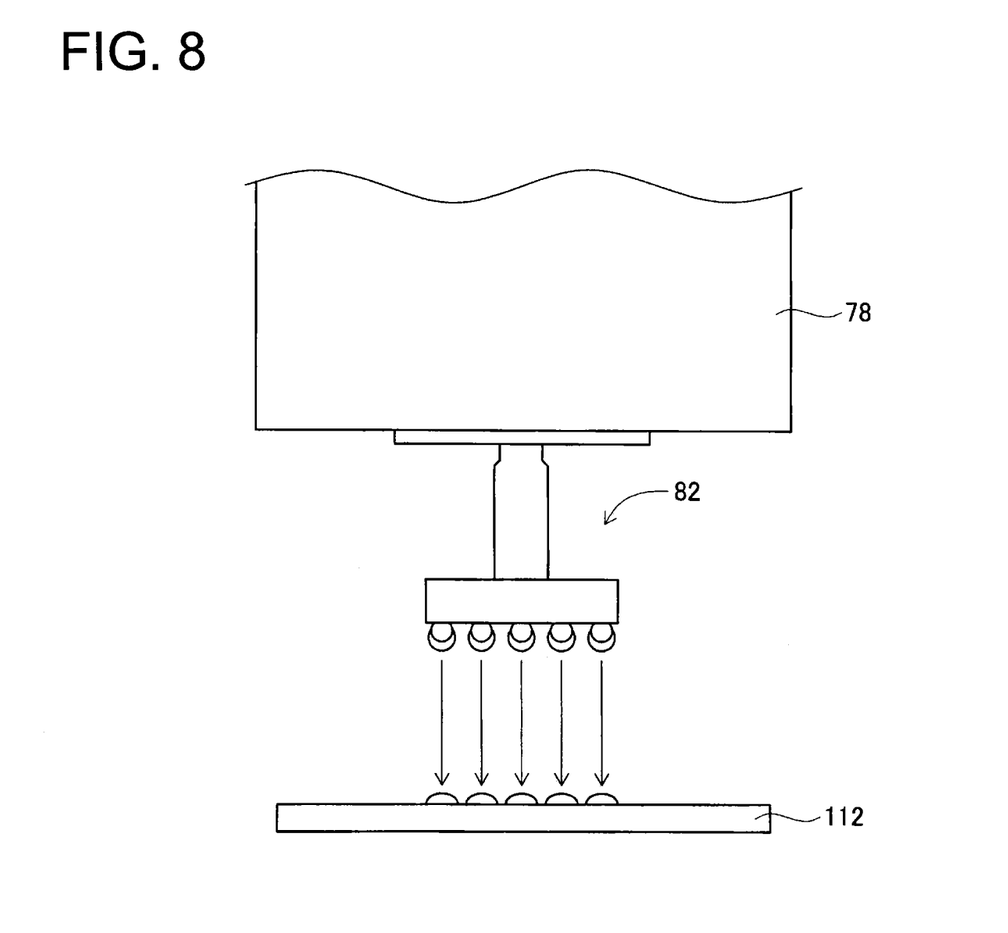
FIG. 8 is a schematic view showing the ball holder when the solder balls immersed in the flux are mounted onto the flux transferred onto the circuit board.

After the ball immersion step ends, the working head 28 is moved to a position above the circuit board by the moving device 30. In this case, the working head 28 is moved so that the solder balls can be mounted on the flux that has been transferred onto the circuit board 112 in the viscous fluid transfer step, and the working head 28 adjusts the rotation angle of the ball holder 82 by the unit rotating unit 92 on the basis of the rotation angle of the ball holder 82 that is obtained by the image taking. Further, the working tool holding unit 78 is moved down by the unit lifting unit 90. Accordingly, the solder balls, which have been immersed in the flux, are mounted on the flux, which has been transferred onto the circuit board 112 in the viscous fluid transfer step, as shown in FIG. 8. Meanwhile, a step of mounting the solder balls, which have been immersed in the flux, on the flux transferred onto the circuit board 112 is a ball mounting step, and a ball mounting unit (see FIG. 4) 118 is provided in the controller 102 of the control device 100 as a functional unit that performs this step.

As described above, in the work for mounting solder balls on the circuit board in the working machine 16, flux is transferred onto the circuit board 112 by the transfer pins 80 and the solder balls, which have been immersed in the flux, are mounted on the transferred flux. Accordingly, the solder balls can be held on the circuit board by a relatively large amount of flux. That is, since the solder balls can be held on the circuit board by a relatively large holding force, the solder balls can be appropriately mounted on the circuit board.

Further, since flux having relatively high viscosity is stored in the first flux tray 74a in which the transfer pins 80 are immersed in the working apparatus 10, flux having high viscosity is transferred onto the circuit board. Accordingly, it is possible to more preferably mount solder balls on the circuit board by a high holding force that is generated by the flux having high viscosity. Meanwhile, when the solder balls, which are held by the ball holder 82, are immersed in the flux having high viscosity, there is a concern that the solder balls may be left in the second flux tray 74b due to a high holding force. For this reason, flux having relatively low viscosity is stored in the second flux tray 74b in which the solder balls held by the ball holder 82 are immersed. Accordingly, it is possible to prevent the solder balls, which are held by the ball holder 82, from being left in the second flux tray 74b.

Moreover, in the working apparatus 10, flux having the relatively small film thickness L2 is stored in the second flux tray 74b in which the solder balls held through suction by the ball holder 82 are immersed. This is to immerse only very small solder balls in the flux, and the amount of flux adhering to the solder balls is very small. Meanwhile, flux having the film thickness L1 much larger than the film thickness L2 is stored in the first flux tray 74a in which the transfer pins 80 are immersed. The reason for this is that the length of the transfer pin 80 is much larger than the diameter of the solder ball. Accordingly, when being compared with the amount of flux adhering to the solder ball, the amount of flux adhering to the transfer pin 80 is much larger than the amount of flux adhering to the solder ball. Therefore, since it is possible to hold the solder balls on the circuit board by a large amount of flux, it is possible to appropriately mount the solder balls on the circuit board.

Incidentally, in the above-mentioned embodiment, the machine 16 for performing work on a board is an example of a working machine for a board, and the working head 28, the moving device 30, the board holding unit 48, the flux trays 74, and the control device 100 of the machine 16 for performing work on a board are examples of a working device, a moving device, a holding device, viscous fluid trays, and a control device. The flux transfer tool 76 and the ball holder 82, which are to be mounted on the working head 28, are examples of a viscous fluid transfer tool and a ball holder, and the transfer pin 80 of the flux transfer tool 76 is an example of a transfer pin. The first and second flux trays 74a and 74b, which form the flux trays 74, are examples of first and second trays. The transfer pin immersing unit 110, the viscous fluid transferring unit 114, the ball immersing unit 116, and the ball mounting unit 118 of the control device 100 are examples of a transfer pin immersing unit, a viscous fluid transferring unit, a ball immersing unit, and a ball mounting unit. Further, the flux is an example of viscous fluid, and the solder ball is an example of a conductive ball.

Meanwhile, the present application is not limited to the above-mentioned embodiment, and can be embodied in various forms that are modified and changed in various ways on the basis of the knowledge of those skilled in the art. Specifically, for example, in the above-mentioned embodiment, two trays, that is, the first and second flux trays 74a and 74b have been employed as a viscous fluid tray, the first flux tray 74a has been used at the time of the immersion of the transfer pins 80, and the second flux tray 74b has been used at the time of the immersion of the solder balls. However, one tray may be adapted to be shared and used at the time of the immersion of the transfer pins 80 and at the time of the immersion of the solder balls.

Further, in the above-mentioned embodiment, the working head 28 on which one working tool is mounted has been employed as the working device. However, a working head on which a plurality of working tools can be mounted can be employed. When the working head on which a plurality of working tools can be mounted is employed, work for exchanging a working tool in the working tool station 106 can be omitted during work for mounting solder balls.

Furthermore, in the above-mentioned embodiment, one working head has been employed as the working device. However, two working heads may be employed. That is, a working head on which the flux transfer tool 76 is mounted and a working head on which the ball holder 82 is mounted may be employed, the transfer pin immersion step and the viscous fluid transfer step may be performed by the working head on which the flux transfer tool 76 is mounted, and the ball immersion step and the ball mounting step may be performed by the working head on which the ball holder 82 is mounted. Meanwhile, when two working heads are employed, these two working heads may be moved by the moving device 30. Alternatively, the moving device 30 may be provided for each of the two working heads, and the two working heads may be individually moved by two moving devices 30.

REFERENCE SIGN LIST

16: machine for performing work on board (working machine for board), 28: working head (working device), 30: moving device, 48: board holding unit (holding device), 74: flux tray (viscous fluid tray), 74a: first flux tray (first tray), 74b: second flux tray (second tray), 76: flux transfer tool (viscous fluid transfer tool), 80: transfer pin, 82: ball holder, 100: control device, 110: transfer pin immersing unit, 114: viscous fluid transferring unit, 116: ball immersing unit, 118: ball mounting unit

The invention claimed is:

1. A working machine for a circuit board comprising:
a holding device that is provided on a base and holds the circuit board at a position where work for the circuit board is performed;
a working device that selectively performs work for mounting conductive balls on the circuit board by a ball holder holding the conductive balls and that selectively performs work for transferring viscous fluid onto the circuit board by a viscous fluid transfer tool including transfer pins that transfer the viscous fluid, which adheres to tip end portions thereof, to the circuit board, the ball holder and the viscous fluid transfer tool being configured to be interchangeable on the working device;
a moving device that moves the working device to a position on the base;
at least one viscous fluid tray in which the viscous fluid is stored; and
a control device that controls operation of the working device and the moving device,
wherein the control device includes:
a transfer pin immersing unit that immerses the transfer pins of the viscous fluid transfer tool in the viscous fluid stored in the at least one viscous fluid tray,
a viscous fluid transferring unit that transfers the viscous fluid onto the circuit board by the transfer pins having been immersed in the viscous fluid,
a ball immersing unit that immerses the conductive balls held by the ball holder in the viscous fluid stored in the at least one viscous fluid tray after the working device exchanges the viscous fluid transfer tool with the ball holder, and a ball mounting unit that mounts the conductive balls having been immersed in the viscous fluid on the circuit board onto which the viscous fluid has been transferred by the viscous fluid transferring unit, wherein the working machine includes a first tray and a second tray as the at least one viscous fluid tray, and viscous fluid of the first tray has a viscosity higher than a viscosity of viscous fluid of the second tray, wherein the transfer pin immersing unit immerses the transfer pins in the viscous fluid of the first tray, and wherein the ball immersing unit immerses the conductive balls, which are held by the ball holder, in the viscous fluid of the second tray.

2. A working machine for a circuit board comprising:

a holding device that is provided on a base and holds the circuit board at a position where work for the circuit board is performed;

a working device that selectively performs work for mounting conductive balls on the circuit board by a ball holder holding the conductive balls and that selectively performs work for transferring viscous fluid onto the circuit board by a viscous fluid transfer tool including transfer pins that transfer the viscous fluid, which adheres to tip end portions thereof, to the circuit board, the ball holder and the viscous fluid transfer tool being configured to be interchangeable on the working device;

a moving device that moves the working device to a position on the base;

at least one viscous fluid tray in which the viscous fluid is stored; and a control device that controls operation of the working device and the moving device, wherein the control device includes:

a transfer pin immersing unit that immerses the transfer pins of the viscous fluid transfer tool in the viscous fluid stored in the at least one viscous fluid tray, a viscous fluid transferring unit that transfers the viscous fluid onto the circuit board by the transfer pins having been immersed in the viscous fluid, a ball immersing unit that immerses the conductive balls held by the ball holder in the viscous fluid stored in the at least one viscous fluid tray after the working device exchanges the viscous fluid transfer tool with the ball holder, and a ball mounting unit that mounts the conductive balls having been immersed in the viscous fluid on the circuit board onto which the viscous fluid has been transferred by the viscous fluid transferring unit, wherein the working machine includes a first tray and a second tray, which store viscous fluid in the form of a thin film, as the at least one viscous fluid tray, and a film thickness of the viscous fluid of the first tray is larger than a film thickness of the viscous fluid of the second tray, wherein the transfer pin immersing unit immerses the transfer pins in the viscous fluid of the first tray, and wherein the ball immersing unit immerses the conductive balls, which are held by the ball holder, in the viscous fluid of the second tray.

3. A working machine for a circuit board comprising:

a holding device that is provided on a base and holds the circuit board at a position where work for the circuit board is performed;

a working device that selectively performs work for mounting conductive balls on the circuit board by a ball holder holding the conductive balls and that selectively performs work for transferring viscous fluid onto the circuit board by a viscous fluid transfer tool including transfer pins that transfer the viscous fluid, which adheres to tip end portions thereof, to the circuit board, the ball holder and the viscous fluid transfer tool being configured to be interchangeable on the working device;

a moving device that moves the working device to a position on the base;

at least one viscous fluid tray in which the viscous fluid is stored; and a camera that captures images of the circuit board and the working device;

a control device that controls operation of the working device and the moving device, wherein the control device includes:

a transfer pin immersing unit that immerses the transfer pins of the viscous fluid transfer tool in the viscous fluid stored in the at least one viscous fluid tray, a viscous fluid transferring unit that transfers the viscous fluid onto the circuit board by the transfer pins having been immersed in the viscous fluid, a ball immersing unit that immerses the conductive balls held by the ball holder in the viscous fluid stored in the at least one viscous fluid tray after the working device exchanges the viscous fluid transfer tool with the ball holder, and a ball mounting unit that mounts the conductive balls having been immersed in the viscous fluid on the circuit board onto which the viscous fluid has been transferred by the viscous fluid transferring unit, and wherein after the working device exchanges the viscous fluid transfer tool with the ball holder, the camera captures an image of the working device to determine a rotation angle of the ball holder.

* * * * *